US008928935B2

(12) United States Patent
Such et al.

(10) Patent No.: US 8,928,935 B2
(45) Date of Patent: Jan. 6, 2015

(54) COLOR ACCURACY CHECK

(75) Inventors: Alberto Such, Barcelona (ES); Andres Gonzalez, Cerdanyola del Valles (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 2006 days.

(21) Appl. No.: 11/234,923

(22) Filed: Sep. 26, 2005

(65) Prior Publication Data

US 2006/0092442 A1 May 4, 2006

(30) Foreign Application Priority Data

Oct. 28, 2004 (EP) .................................... 04105367

(51) Int. Cl.

| | |
|---|---|
| ***B41F 1/54*** | (2006.01) |
| ***G06F 15/00*** | (2006.01) |
| ***G03F 3/08*** | (2006.01) |
| ***B44D 3/00*** | (2006.01) |

(52) U.S. Cl.

CPC ...................................... *B44D 3/003* (2013.01)

USPC ............. 358/1.9; 358/2.1; 358/518; 101/484; 382/164

(58) Field of Classification Search

None

See application file for complete search history.

(56) References Cited

U.S. PATENT DOCUMENTS

| | | | | |
|---|---|---|---|---|
| 5,231,481 | A | 7/1993 | Eouzan et al. | |
| 5,363,318 | A * | 11/1994 | McCauley | 702/85 |
| 5,600,574 | A | 2/1997 | Reitan | |
| 5,791,251 | A * | 8/1998 | Kistler et al. | 101/484 |
| 5,809,366 | A * | 9/1998 | Yamakawa et al. | 399/39 |
| 6,043,909 | A | 3/2000 | Holub | |
| 6,157,735 | A | 12/2000 | Holub | |
| 6,185,001 | B1 | 2/2001 | Webendorfer et al. | |
| 6,215,562 | B1 | 4/2001 | Michel et al. | |
| 6,380,951 | B1 | 4/2002 | Petchenkine et al. | |
| 6,389,968 | B1 | 5/2002 | Sugimoto et al. | |
| 6,459,425 | B1 | 10/2002 | Holub et al. | |
| 6,469,805 | B1 | 10/2002 | Behlok | |
| 6,483,524 | B1 | 11/2002 | Petchenkine et al. | |
| 6,607,258 | B2 | 8/2003 | Jodra et al. | |
| 6,624,908 | B1 | 9/2003 | Petchenkine et al. | |
| 6,707,931 | B2 | 3/2004 | Herbert | |
| 6,721,068 | B2 | 4/2004 | Weiss | |
| 6,750,992 | B1 | 6/2004 | Holub | |
| 7,110,143 | B2 * | 9/2006 | Bares et al. | 358/2.1 |
| 2002/0104457 | A1 | 8/2002 | Brydges et al. | |
| 2002/0126328 | A1 * | 9/2002 | Lehmeier et al. | 358/518 |
| 2002/0181017 | A1 * | 12/2002 | Such et al. | 358/1.15 |

(Continued)

FOREIGN PATENT DOCUMENTS

| | | |
|---|---|---|
| EP | 0188561 | 7/1985 |
| JP | 9011446 | 1/1997 |

(Continued)

OTHER PUBLICATIONS efi™ Colorproof Xf™ Graphic Arts Solutions, Mar. 12, 2001.*

(Continued)

*Primary Examiner* — Barbara Reinier

(57) ABSTRACT

A system and method for color accuracy checking is discussed. In one embodiment, areas within a document are selected for color-checking. A confirmation is made that a second printing of the document has color values which deviate within tolerances from color values of a first printing of the document within each of the selected areas.

25 Claims, 3 Drawing Sheets

(56) References Cited

U.S. PATENT DOCUMENTS

| | | | | |
|---|---|---|---|---|
| 2003/0048945 A1* | 3/2003 | Tamagawa | | 382/167 |
| 2004/0141192 A1* | 7/2004 | Jodra et al. | | 358/1.9 |
| 2004/0150845 A1* | 8/2004 | Brouhon | | 358/1.9 |
| 2004/0199865 A1* | 10/2004 | Bie et al. | | 715/500 |
| 2004/0239935 A1* | 12/2004 | Kitazawa | | 356/406 |
| 2005/0052668 A1* | 3/2005 | Hoshino | | 358/1.9 |

FOREIGN PATENT DOCUMENTS

| | | |
|---|---|---|
| JP | 10000764 | 1/1998 |
| JP | 2000013627 | 1/2000 |
| JP | 2002086689 | 3/2002 |
| JP | 2004515386 | 5/2004 |

OTHER PUBLICATIONS

Remote Proofing: Not Just for Big City Printers Ron Ellis, First posted Jul. 15, 2004.*

CIP4 and JDF, seen from different perspectives (user & vendor) Holger Schuppan, Best, a division of EFI Jun. 2003 Slides 1, 37 and 40.*

JDF Specification Release 1.0, International Cooperation for Integration of Processes in Prepress, Press and Postpress, (known as CIP4), (c) 2000-2001, pp. 1-3 & 241-242.*

Best Remoteproof™, (C) 2002 Best GmbH.*

"Best Remoteproof Concept", http://www.bestcolor.com/index.php?sv=180, May 20, 2004.

Japanese Office Action for Japanese Patent Application No. 2005-313956, mailed Jan. 18, 2008 (2 pages).

* cited by examiner

COLOR ACCURACY CHECK

RELATED APPLICATIONS

This patent application is related to, and claims priority from, EPO Patent Application Serial No. 04105367.9, entitled "Color Accuracy Check," filed on 28 Oct. 2004, commonly assigned herewith, and hereby incorporated by reference.

TECHNICAL FIELD

The invention relates to color accuracy checking in printed documents.

BACKGROUND

It is frequently the case that an author will send a document to a remote location which is equipped and configured to perform a print job. Typically, the remote location includes printing presses that are well-suited to produce many copies of the document. Unfortunately, producing a print job that includes a large number of copies involves some risk, in that if the copies include color errors the entire printed batch may be worthless. Such color errors can result, for example, when colors are not printed with enough accuracy, or when the printed colors do not represent the exact colors intended by the content designer. As a result, it is common to create a proof, which is sent to the author, typically using a common carrier. If the proof is flawed, corrections may be made, and a second proof printed for the author's approval. This process can be continued and/or repeated until the results of the proof are correct (e.g. acceptable to the content designer). Upon approval of the proof, a print job including many copies of the document can be printed. Accordingly, by using the proof, costly errors can be prevented. However, the entire process can be time-consuming, in part because the proof must be transmitted back to the author for approval.

An alternate system involves insertion of color bars or some multi-color patches within a document contained within a print job. The color bars are configured to have a standardized appearance when properly printed. Thus, the printer at the remote location can print a proof of the document, including the required color bars. The color bars can be checked, to confirm that they are within tolerances of a standard appearance. The check may be made visually, by a person, or by use of a tool, such as a densitometer, calorimeter or spectrophotometer. Where the results of the check indicate, the print job may be completed.

Use of color bars is quite common, particularly in situations where color consistency between proofs printed at different sites, between proofs and a production run or between different production runs must be ensured. However, in many cases the color bars themselves are detrimental, in that it is generally not desirable to have color bars in the actual print job. Thus, after the proof is approved, the document file itself may be altered, to remove the color bars, or the printed pages may be cropped, thereby removing areas wherein the color bars are defined. Color bars also tend to provide a somewhat generic test of a subset of the colors contained within the proof, and do not provide any emphasis on a range of colors which are particularly important for the document. Thus, while the proof may appear to be correctly printed based on a review of colors present in the document which were tested by the color bars, colors in certain areas of the document may be somewhat altered from their desired hue. For example, a variety of different flesh tones may not be correctly printed. This error may result because the color bars may not be configured to provide adequate checking for the colors required by a particular print job.

Accordingly, improved systems and methods for printing color documents from a remote location, while ensuring color consistency and accuracy, are required.

SUMMARY

A system and method for color accuracy checking is discussed. In one embodiment, areas within a document are selected for color-checking. A confirmation is made that a second printing of the document has color values which deviate within tolerances from color values of a first printing of the document within each of the selected areas.

BRIEF DESCRIPTION OF THE DRAWINGS

The following detailed description refers to the accompanying figures. In the figures, the left-most digit(s) of a reference number identifies the figure (Fig.) in which the reference number first appears. Moreover, the same reference numbers are used throughout the drawings to reference like features and components.

DETAILED DESCRIPTION

As described herein, examples of a system for color accuracy checking disclose checking of specific areas within proofs printed by proofers in first and second locations and confirming that the second proof deviates from the first by less than assigned tolerances. In one example of the concepts illustrated, the system is configured with a first proofer for use by a document author. The document author can not only approve or reject the proof based on color or other factors, but can also select areas within the proof within which accuracy of the color is to be closely controlled. Each selected area can be assigned a color value or a color value range which is required for acceptance of the print job. Information indicating the selected locations and color ranges can be bundled with the job ticket and sent to a second proofer. In one example, the second proofer is located to allow convenient use by a job printer. The selected areas of a second proof are evaluated, and the print job is performed if the evaluation indicates that the selected areas of the second proof are within tolerances of the acceptable color values.

Figure 1:
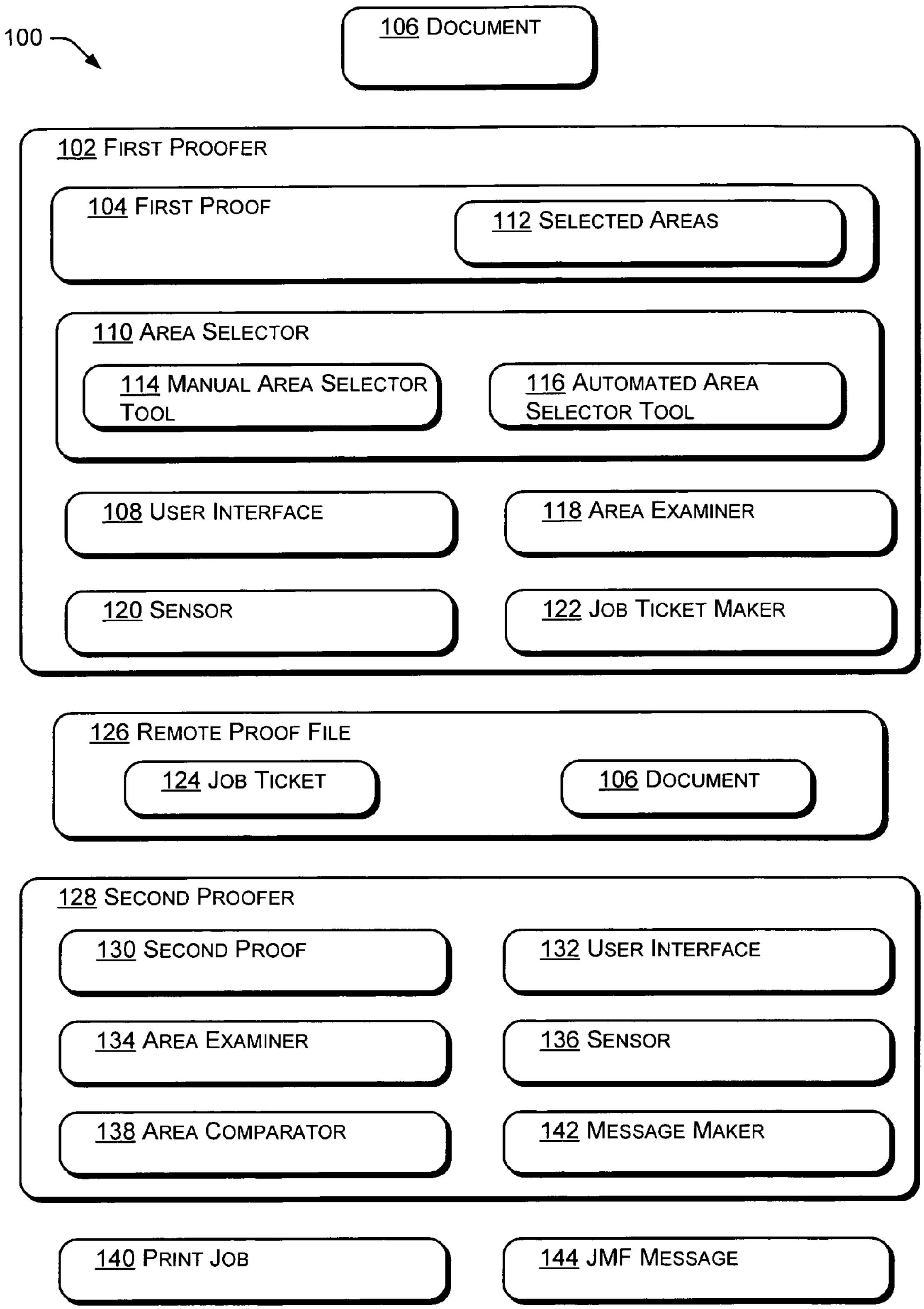
FIG. 1 is an example of a color accuracy checking system, illustrated as a block diagram.

FIG. 1 is an example of a color accuracy checking system 100 configured for production of a first proof at a first location, which may be conveniently located with respect to the document author. Areas within the first proof may be selected, and colors or color ranges associated with each of the selected areas. The color accuracy checking system 100 also provides for production of a second proof at a second location, which may be conveniently located with respect to a printing facility. The selected areas within the second proof are examined to determine if the colors within the selected areas are within the associated color ranges of the selected areas of the first proof.

In the example of the color accuracy checking system 100 of FIG. 1, a first proofer 102 is configured to print a first proof 104 of a document 106. The document 106 can be in almost any format, such as PDF (portable document format) or others. A user interface 108 may be provided by the first proofer 102 or by a computer system (not shown) in communication with the first proofer 102. The user interface 108 may be configured to allow a user (e.g., the author of the document 106) to operate an area selector 110.

The area selector 110 is configured to select, or facilitate selection of, one or more areas 112 within the proof 104 for association with colors or ranges of color within which a print job of the document must be restricted. The area selector 110 may be configured in software or hardware (e.g. as an application specific integrated circuit, i.e. an "ASIC"). The selected areas 112 are typically areas within which it is particularly important that the color be closely controlled. For example, the user may operate the area selector 110 to select areas 112 of the proof 104 of the document 106 which contain corporate logos, peoples' faces or other objects for which control over the ultimate color in the print job is particularly important.

The area selector 110 may include one or both of a manual area selector tool 114 and/or an automated area selector tool 116. The manual area selector tool 114 may utilize tools provided by the user interface 108 to allow the user to "circle" with a pointing device (e.g. a mouse) or otherwise manually define areas 112 within the document 106. For example, the user may utilize the manual area selector tool 114 to select areas within which are peoples' faces, corporate logos or other objects over which it is desired to maintain tight color control tolerances.

The area selector 110 may include an automated area selector tool 116. The automated area selector tool 116 may be configured with algorithms which attempt to locate corporate logos, peoples' faces and other important areas within documents in an automated fashion. Upon location one or more such objects, an area may be defined about the object. Alternatively, the automated area selector tool 116 may select areas 112 in any fashion that appears appropriate. For example, one or more particularly colorful areas of the proof 104 of the document 106 may be selected automatically.

An area examiner 118 is configured to operate one or more sensors 120 to examine the selected areas 112 within the proof 104. The area examiner 118 is therefore able to interpret signals coming from the sensor(s) 120 to determine a color value(s) for each area. The area examiner 118 may be configured in software or hardware (e.g. as an application specific integrated circuit, i.e. an "ASIC"). Additionally, the area examiner 118 may be configured to position the sensors 120 to examine the selected areas 112. In one embodiment, the area examiner 118 is configured to take measurements automatically, using information from the area selector 110, which indicates the areas which should be examined. Such an automatically operated area examiner 118 may be integrated into the printing system 100, such as within the first proofer 102. Accordingly, the measurements made by the area examiner 118 may be made during the printing process. Alternatively, the area examiner 118 could be configured within a second device; however, such a configuration may reduce overall efficiency. The sensors 120 may be any desired type of sensor, such as a colorimeter, a densitometer, a spectrophotometer or other sensor type.

The user interface 108 may additionally be configured to allow the user to select a color range for each of the selected areas 112. The color range selected constitutes a range of colors within which the selected area of a second proof would be in compliance. The color range associated with each of the selected areas 112 provides a basis upon which the selected areas of the second proof may be evaluated. If one or more of the selected areas within the second proof are not within the range, then adjustments should be made, and the second proof re-printed. If the second (or subsequent) printing of the second proof is within the color range for each selected area 112, then printing of the second print job could be initiated.

A job ticket maker 122 is configured to create a job ticket 124 for inclusion in a remote proof file 126. In one example, the remote proof file 126 includes the job ticket 124 and a copy of the document 106. The job ticket 124 (or another location, typically within the remote proof file 126) is configured to contain information on the locations of the selected areas 112 within the document 104, the colors and/or color ranges associated with each selected area 112, as well as the results of the color measurements of the selected areas 112 in the first proof 104.

A second proofer 128 is configured to print a second proof 130. A user interface 132 may be configured to allow a user to examine the proof using an area examiner 134 or similar tool. In one embodiment, the area examiner 134 would be configured to operate automatically, with little or no direction from the user interface, to examine the second proof 130 after it is printed. To perform this examination, the area examiner 134 is configured to interpret the signals from one or more sensors 136, which are used to examine the selected areas 112 of the second proof 130 which are identified by the job ticket 124. The interpreted signals results in color data for each of the selected areas 112 for the second proof 130. The color data may be included within the job ticket 124. For example, if an area 112 of the first proof 104 included a portion of a person's face, and was associated a specific color, then the area examiner 134 would examine the color values of the same portion of the person's face in the second proof 130. The area examiner 134 may be configured in software or hardware (e.g. as an application specific integrated circuit, i.e. an "ASIC").

An area comparator 138 is configured to compare the measurement made by the sensors 136 and area examiner 134 of each of the selected areas on the second proof 130 with data containing the color measurements of each of the selected areas 112 of the first proof 104. The area comparator 138 may be configured in software or hardware (e.g. as an application specific integrated circuit, i.e. an "ASIC"). Where the measurements of the selected areas of the second proof 128 are within tolerances (e.g. within a range) indicated by data sent by the first proofer 102, the proof is approved. Where the measurements of the selected areas 112 of the second proof 128 are not within the tolerances, the second proof is rejected. By rejecting the second proof 130, the prospect of having a print job 140 wherein the color is incorrect in one or more selected areas is avoided. Note that the sensors 136 may be any desired type of sensor, such as a colorimeter, a densitometer, a spectrophotometer or other sensor type. However, the sensor 136 selected is typically of the same type and/or technology as the sensor 120.

A message maker 142 is configured to create a message 144—which may be in the JMF (job messaging format)—for transmission back to the first proofer 102 and/or the operator of the user interface 108 or the author of the document 106. The message 144 may be configured to indicate the results of the examination by the area examiner 134 and sensor 136 and the results of the comparison by the area comparator 138 of the selected areas of the second proof 130. In particular, the message 144 created by the message maker 142 may indicate whether the second proof 130 created by the second proofer

128 was acceptably close to the first proof 104, and whether the print job 140 was indicated and/or actually produced.

Figure 2:
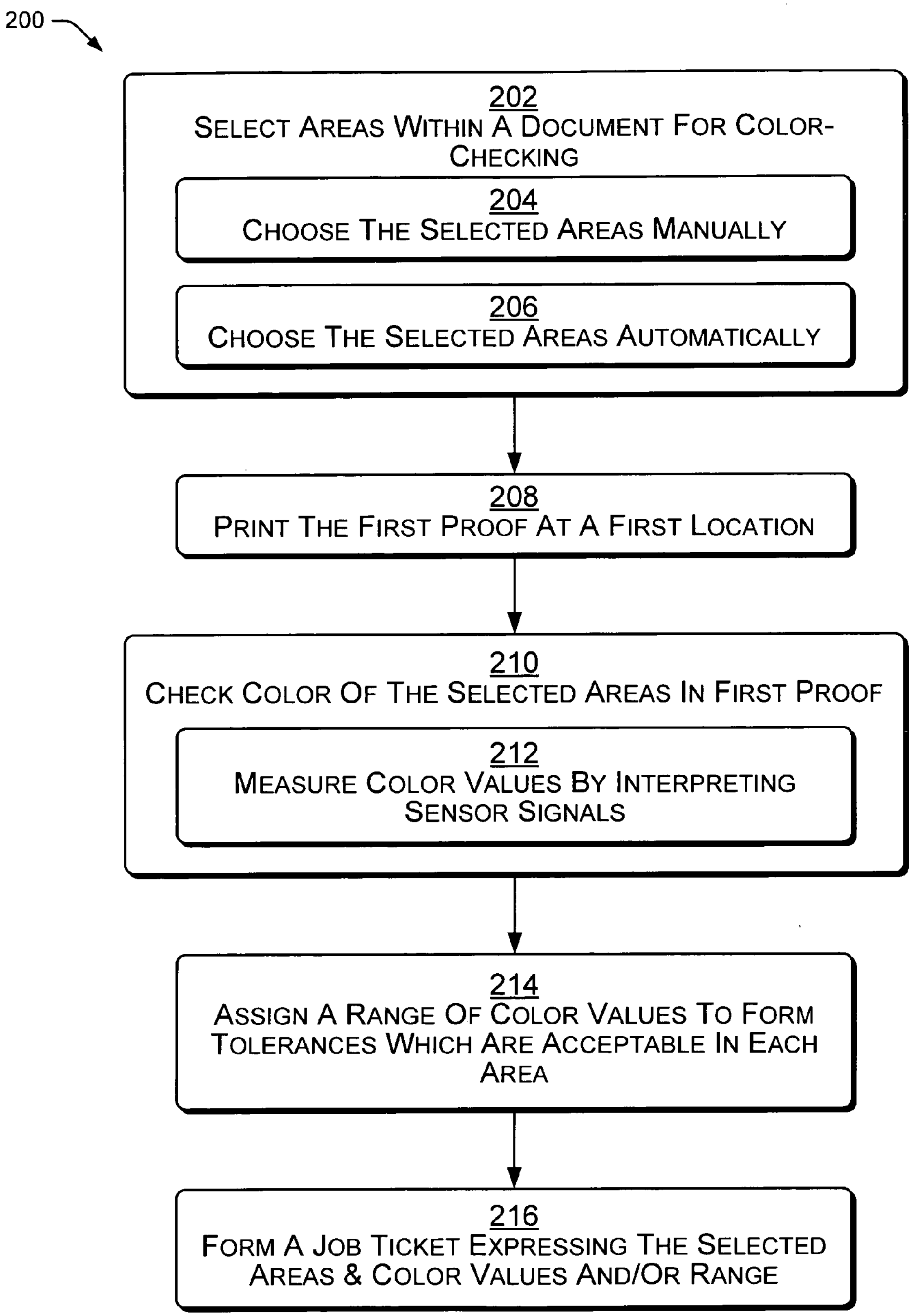
FIG. 2 is an example of a method by which color accuracy checking may be performed, wherein a flow diagram particularly shows events taking place on a proof originator.

FIG. 2 is an example of a method by which color accuracy checking may be performed, wherein a flow diagram 200 particularly shows events taking place on a first proofer 102 or proof originator. At block 202, areas 112 within a first proof 104 of a document 106 are selected for color checking. This may be performed in a number of ways, two of which are listed here, and others of which may be easily envisioned in view of the optional embodiments listed herein. Where two or more ways of selecting areas for color checking are provided, the user may be allowed to elect between them. For example, the user may elect to select areas manually or the user may elect for the areas to be selected in an automated manner. In a first alternative, seen at block 204, the selected areas 112 are manually chosen. As seen earlier with respect to the discussion of FIG. 1, the selected areas 112 of the first proof 104 may be selected through use of a manual area selector tool 114, typically operated through a user interface 108. In one example, the user may indicate an area of the proof 104 for selection, such as the image of a corporate logo or a person's face. In a second alternative, seen at block 206, the selected areas may be chosen automatically. As seen earlier with respect to the discussion of FIG. 1, the selected areas 112 of the first proof 104 may be selected through use of an automated area selector tool 116.

At block 208, the first proof 104 is printed at a first location, such as the first proofer 102. In one example, the author of a document 106 uses a local proofer 102 to print the first proof 104. In a more general example, the first proof 104 is representative of any type of printing, made at the first location. While a common example of the first printing is the first proof 104, the first printing might alternatively be a first printing run of a document or a first part of a single run of a print job, printed at a first device.

At block 210, the color of the selected areas 112 of the first proof 104 are checked. This may be performed in a number of ways, one of which is listed here, and others of which may be easily envisioned in view of the optional embodiments listed herein. In the example of block 212, color values are measured by interpreting signals from the sensor 120 by the area examiner 118. The check of the selected areas 112 of the first proof 104 may be performed by sensors 120 which are integrated into the structure of the first proofer 102. Therefore, the check of the selected areas 112 may be made automatically, as the proof 104 moves within a paper path defined within the proofer 102.

At block 214, a range of color values may be assigned to form the tolerances which are acceptable in each of the selected areas 112. For example, the user interface 108 may allow the user to assign a narrow range of colors which are acceptable for any given selected area 112, if the area's color is very important. Similarly, the user interface 108 may allow the user to assign a somewhat broader range of colors which are acceptable for use within another selected area 112, if precise control over that area's color is less important.

At block 216 a job ticket 124 is formed to include descriptions of the locations of the selected areas 112 within the proof 104 of the document 106. Additionally, the job ticket 124 is configured to include color values or ranges which are associated with each of the selected areas 112.

Figure 3:
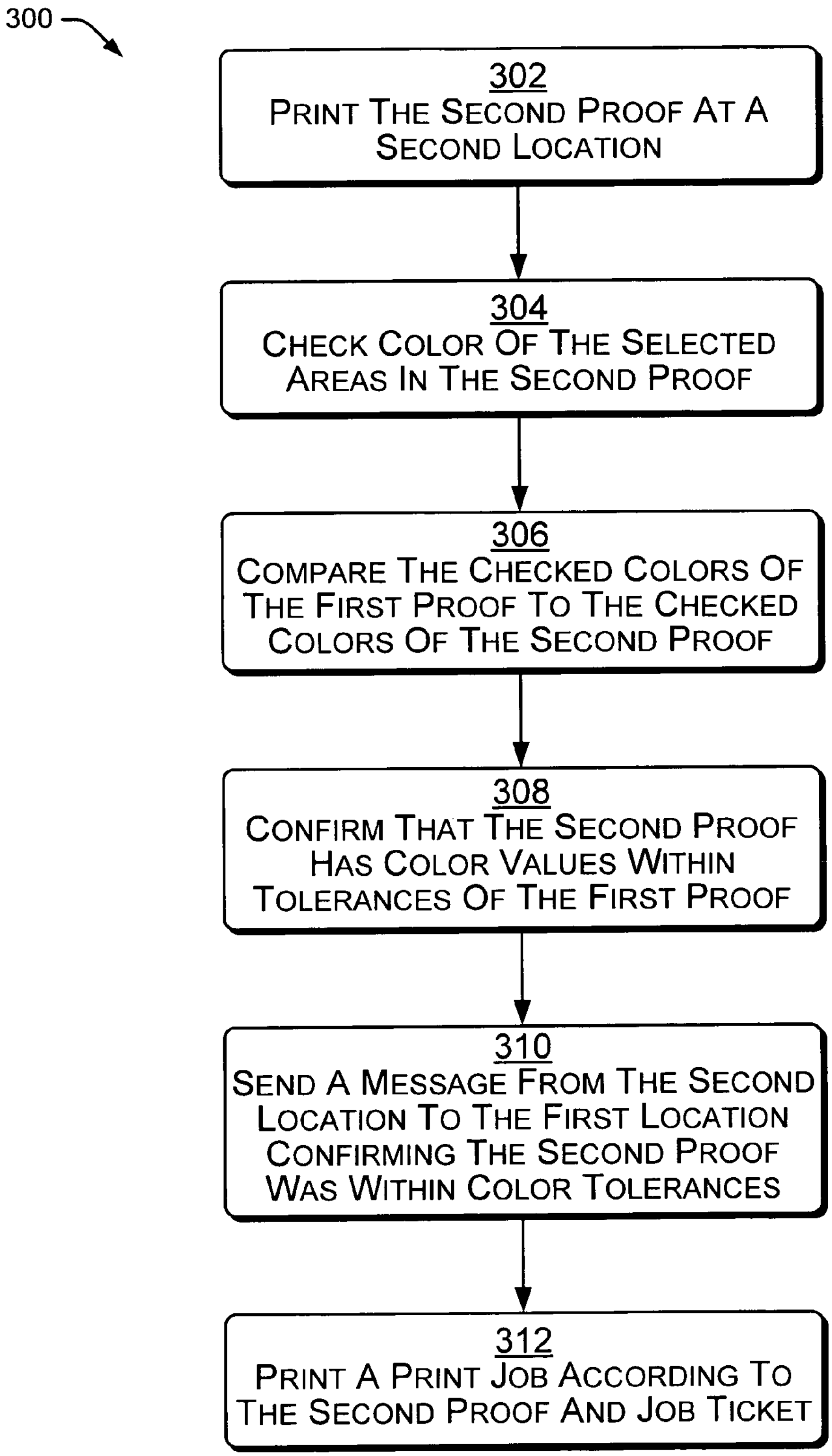
FIG. 3 is a second example of a method by which color accuracy checking may be performed, wherein a flow diagram particularly shows events taking place on a proof receiver.

FIG. 3 is an example of a method by which color accuracy checking may be performed, wherein a flow diagram 300 particularly shows events taking place on a second proofer 128 or proof receiver. At block 302, a second proof at a second location is printed. In one example, second proof 130 may be printed by the second proofer 128 at the location of a printing press facility. In a more general example, the second proof 130 is representative of any type of printing, made at the second location. While a common example of the second printing is the second proof 130, the second printing might alternatively be a second printing run of a document or a second part of a single run of a print job, printed at a second device.

At block 304, color of the selected areas 112 of the second proof 130 are checked. This may be performed in a number of ways; for example, color values may be measured by interpreting signals from the sensor 136 by the area examiner 134.

At block 306, the checked colors of the first proof 104 are compared to the checked colors of the second proof 130 for each of the selected areas 112. In particular, at block 308 it is confirmed that—if true—the second proof has color values that are within tolerances of the first proof.

At block 310, a message is sent from the second location to the first location confirming that the second proof was within the color tolerances. In one embodiment, a JMF message 144 is sent from the second proofer 128, located at a printing press site, to the first proofer 102, located at the site of the author of the document 106.

At block 312, a print job is printed according to the second proof and the job ticket. In the example illustrated, the job ticket 124 and document 106 are used to create the print job 140.

The hardware and software structures and functionality herein described, and seen in FIGS. 1-3, may be added retroactively to many proofers currently available on the commercial marketplace. For example, The Hewlett-Packard Company manufactures and sells proofing devices adaptable for use in combination with the elements of FIGS. 1-3. In particular, the HP Design Jet 30 and HP Design Jet 130 printer series could be so adapted. Alternatively, the structures and functionality may be added to the design of an otherwise conventional proofer(s), thereby resulting in a proofer(s) having the enhanced qualities described in this document.

Although the above disclosure has been described in language specific to structural features and/or methodological steps, it is to be understood that the appended claims are not limited to the specific features or steps described. Rather, the specific features and steps are exemplary forms of implementing this disclosure. For example, while actions described in blocks of the flow diagrams may be performed in parallel with actions described in other blocks, the actions may occur in an alternate order, or may be distributed in a manner which associates actions with more than one other block. And further, while elements of the methods disclosed are intended to be performed in any desired manner, it is anticipated that computer- or processor-readable instructions, performed by a computer and/or processor, typically located within a proofer or associated computer or print server, reading from a computer- or processor-readable media, such as a ROM, disk or CD ROM, would be preferred, but that an application specific gate array (ASIC) or similar hardware structure, could be substituted.

The invention claimed is:

1. A method for color accuracy checking, the method comprising:

selecting areas within a document for color-checking, the document desired to be printed by a user, the areas being other than particular areas added to or that are part of the document solely or primarily for color accuracy checking;

confirming that a second printing of the document has measured color values which deviate within tolerances from measured color values of a first printing of the document within each of the selected areas; and forming a job ticket comprising the selected areas and color values for each of the selected areas;

wherein forming the job ticket comprises:

expressing the color values for each of the selected areas as a range, wherein breadth of each range is controlled according to a required precision of the associated selected area, wherein the breadths of the ranges of the color values of the selected areas are capable of being different, wherein the breadth of the range of the color values of a first selected area is narrower than the breadth of the range of the color values of a second selected area.

2. The method of claim 1, wherein the first and second printings are:

first and second proofs; first and second runs of the same document; or first and second parts of a single run printed on first and second devices.

3. The method of claim 1, wherein selecting areas comprises: manually choosing the selected areas.

4. The method of claim 1, wherein selecting areas comprises: automatically choosing the selected areas.

5. The method of claim 1, wherein selecting areas comprises: assigning a range of color values to form the tolerances which are acceptable for each of the selected areas.

6. The method of claim 1, wherein the confirming comprises: measuring color values by interpreting signals from a sensor to obtain color values for each of the selected areas.

7. The method of claim 1, additionally comprising: printing the first and second printings at different locations.

8. The method of claim 1, additionally comprising:

sending a message, from a second location at which the second printing was printed, to a first location at which the first printing was printed, wherein the message indicates results of the confirming.

9. The method of claim 1, additionally comprising:

printing a print job according to the second printing, when the color values of the second printing are within the tolerances of the color values of the first printing for each of the selected areas.

10. The method of claim 1, additionally comprising: printing the document using a first proofer;

checking color of the selected areas;

sending the job ticket to a second proofer;

checking color of the selected area in the second printing;

comparing the checked color of the selected area within the first document to the checked color of the selected area within the second document; and sending a message from the second proofer to the first proofer confirming the second printing was within the range of color values.

11. One or more non-transitory computer-readable media comprising computer-executable instructions configured to implement the method steps of claim 1.

12. A color accuracy checking apparatus, comprising:

an area selector, configured to select at least a first and second area within a proof of a document for color accuracy checking, the document desired to be printed by a user, the first and the second areas being other than particular areas added to or that are part of the document solely or primary for color accuracy checking;

an area examiner, configured to examine each of the selected areas within the proof to determine color values for each of the selected areas; and a job ticket maker to form a job ticket comprising locations of each of the selected areas and associated color values for each of the selected areas:

wherein the associated color values for each of the selected areas are expressed as a range, wherein breadth of each range is separately controlled according to a precision required by each of the associated first or second selected area, wherein the breadths of the ranges of the associated color values of the selected areas are capable of being different, wherein the breadth of the range of the associated color values of the first selected area is narrower than the breadth of the range of the associated color values of the second selected area.

13. The color accuracy checking apparatus of claim 12, wherein the area selector comprises:

a user interface; and a tool, operable through the user interface, to allow the first and second selected areas to be indicated by manual operation.

14. The color accuracy checking apparatus of claim 13, wherein the user interface allows each of the first and second selected areas to be independently associated with an amount by which color within the first and second selected areas may be allowed to vary.

15. The color accuracy checking apparatus of claim 12, wherein the area examiner comprises a sensor selected from a group of sensors consisting of a colorimeter, a densitometer and a spectrophotometer.

16. The color accuracy checking apparatus of claim 12, wherein:

the job ticket maker is configured to include within the job ticket an amount by which color within each of the first and second selected areas may vary; and the job ticket is configured in Job Description Format.

17. The color accuracy checking apparatus of claim 12, additionally comprising:

a first proofer to print the proof; and a sensor configured within the first proofer to examine the proof in response to the area examiner.

18. The color accuracy checking apparatus of claim 12, additionally comprising:

a second proofer to receive a file comprising the job ticket and document and to create a second proof;

a second sensor configured within the second proofer to examine the second proof at the first and second selected areas as indicated by the job ticket to obtain second measurements of the first and second selected areas; and a message maker to report if the second measurements deviated from the color values in the job ticket.

19. The color accuracy checking apparatus of claim 18, wherein the message maker reports using Job Messaging Format.

20. A color accuracy checking apparatus, comprising:

means for selecting at least a first and second area within a document for color-checking, the document desired to be printed by a user, the areas being other than particular areas added to or that are part of the document solely or primarily for color accuracy checking;

means for examining the selected areas of a proof to determine color values for each of the first and second selected areas; and means for forming a job ticket comprising indicators of locations of the first and second selected areas and the color values of the proof for each of the first and second selected areas;

wherein the color values of the proof for each of the first and second selected areas are expressed as a range, wherein breadth of each range is separately controlled according to a precision required by each of the associated first or second selected area, wherein the breadths of the ranges of the color values of the selected areas are capable of being different, wherein the breadth of the range of the color values of the first selected area is narrower than the breadth of the range of the color values of the second selected area.

21. The color accuracy checking apparatus of claim 20, wherein the means for examining the first and second selected areas comprises:

means for interpreting signals from a sensor to obtain the color values for each of the first and second selected areas.

22. The color accuracy checking apparatus of claim 20, additionally comprising:

means for printing a second proof of the document according to the job ticket;

means for measuring the first and second selected areas of the second proof; and means for comparing the measured first and second selected areas of the second proof to the color values of the proof.

23. The color accuracy checking apparatus of claim 20, additionally comprising:

means for sending a message from a second location, at which the second proof was printed, to a first location at which the proof was printed, wherein the message indicates results of the means for comparing.

24. The color accuracy checking apparatus of claim 20, additionally comprising:

means for printing a print job according to the second proof and the job ticket.

25. One or more non-transitory computer-readable media comprising computer-executable instructions configured to operate the color accuracy checking apparatus of claim 20.

* * * * *